(12) United States Patent
Lu et al.

(10) Patent No.: US 8,546,254 B2
(45) Date of Patent: Oct. 1, 2013

(54) MECHANISMS FOR FORMING COPPER PILLAR BUMPS USING PATTERNED ANODES

(75) Inventors: Wen-Hsiung Lu, Jhonghe (TW); Ming-Da Cheng, Jhubei (TW); Chih-Wei Lin, Xinfeng Township (TW); Chung-Shi Liu, Shin-Chu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 259 days.

(21) Appl. No.: 12/859,379

(22) Filed: Aug. 19, 2010

(65) Prior Publication Data
US 2012/0043654 A1  Feb. 23, 2012

(51) Int. Cl.
*H01L 21/44* (2006.01)
(52) U.S. Cl.
USPC ...... 438/614; 438/612; 438/613; 257/E21.479
(58) Field of Classification Search
USPC .................................. 438/614; 257/E21.479
See application file for complete search history.

(56) References Cited

U.S. PATENT DOCUMENTS

| | | | |
|---|---|---|---|
| 3,528,090 A * | 9/1970 | Laer Karel Jakobus Blok Van | ................................ 205/123 |
| 4,380,867 A | 4/1983 | Antson | |
| 4,720,740 A | 1/1988 | Clements et al. | |
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,134,460 A | 7/1992 | Brady et al. | |
| 5,380,681 A | 1/1995 | Hsu | |
| 5,391,917 A | 2/1995 | Gilmour et al. | |
| 5,448,114 A | 9/1995 | Kondoh et al. | |
| 5,466,635 A | 11/1995 | Lynch et al. | |
| 5,481,133 A | 1/1996 | Hsu | |
| 5,510,298 A | 4/1996 | Redwine | |
| 5,747,881 A | 5/1998 | Hosomi et al. | |
| 5,767,001 A | 6/1998 | Bertagnolli et al. | |
| 5,998,292 A | 12/1999 | Black et al. | |
| 6,002,177 A | 12/1999 | Gaynes et al. | |
| 6,184,060 B1 | 2/2001 | Siniaguine | |
| 6,187,678 B1 | 2/2001 | Gaynes et al. | |
| 6,191,493 B1 | 2/2001 | Yasunaga et al. | |

(Continued)

FOREIGN PATENT DOCUMENTS

| JP | 1993335313 | 12/1993 |
|---|---|---|
| JP | 2000228420 | 8/2000 |

OTHER PUBLICATIONS

Kim, K. S., et al., "The Interface Formation and Adhesion of Metals (Cu, Ta, and Ti) and Low Dielectric Constant Polymer-Like Organic Thin Films Deposited by Plasma-Enhanced Chemical Vapor Deposition Using Para-Xylene Precursor", Thin Solid Films 377-378 (2000), pp. 122-128.

(Continued)

*Primary Examiner* — Angel Roman
(74) *Attorney, Agent, or Firm* — Lowe Hauptman & Ham, LLP

(57) ABSTRACT

The mechanisms of preparing bump structures described by using patterned anodes may simplify bump-making process, reduce manufacturing cost, and improve thickness uniformity within die and across the wafer. In addition, the mechanisms described above allow forming bumps with different heights to allow bumps to be integrated with elements on a substrate with different heights. Bumps with different heights expand the application of copper post bumps to enable further chip integration.

20 Claims, 8 Drawing Sheets

(56) References Cited

U.S. PATENT DOCUMENTS

| | | |
|---|---|---|
| 6,218,281 B1 | 4/2001 | Watanabe et al. |
| 6,229,216 B1 | 5/2001 | Ma et al. |
| 6,229,220 B1 | 5/2001 | Saitoh et al. |
| 6,232,563 B1 | 5/2001 | Kim et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,322,903 B1 | 11/2001 | Siniaguine et al. |
| 6,355,501 B1 | 3/2002 | Fung et al. |
| 6,426,556 B1 | 7/2002 | Lin |
| 6,434,016 B2 | 8/2002 | Zeng et al. |
| 6,448,168 B1 | 9/2002 | Rao et al. |
| 6,448,661 B1 | 9/2002 | Kim et al. |
| 6,464,895 B2 | 10/2002 | Forat et al. |
| 6,465,892 B1 | 10/2002 | Suga |
| 6,472,293 B1 | 10/2002 | Suga |
| 6,492,198 B2 | 12/2002 | Hwang |
| 6,538,333 B2 | 3/2003 | Kong |
| 6,562,653 B1 | 5/2003 | Ma et al. |
| 6,570,248 B1 | 5/2003 | Ahn et al. |
| 6,576,493 B1 | 6/2003 | Lin et al. |
| 6,578,754 B1 | 6/2003 | Tung |
| 6,590,295 B1 | 7/2003 | Liao et al. |
| 6,592,019 B2 | 7/2003 | Tung |
| 6,599,778 B2 | 7/2003 | Pogge et al. |
| 6,600,222 B1 | 7/2003 | Levardo |
| 6,607,938 B2 | 8/2003 | Kwon et al. |
| 6,639,303 B2 | 10/2003 | Siniaguine |
| 6,661,085 B2 | 12/2003 | Kellar et al. |
| 6,664,129 B2 | 12/2003 | Siniaguine |
| 6,693,361 B1 | 2/2004 | Siniaguine et al. |
| 6,731,003 B2 | 5/2004 | Joshi et al. |
| 6,740,582 B2 | 5/2004 | Siniaguine |
| 6,762,076 B2 | 7/2004 | Kim et al. |
| 6,770,958 B2 | 8/2004 | Wang et al. |
| 6,790,748 B2 | 9/2004 | Kim et al. |
| 6,800,930 B2 | 10/2004 | Jackson et al. |
| 6,818,545 B2 | 11/2004 | Lee et al. |
| 6,828,677 B2 | 12/2004 | Yap et al. |
| 6,841,883 B1 | 1/2005 | Farnworth et al. |
| 6,853,076 B2 | 2/2005 | Datta et al. |
| 6,869,831 B2 | 3/2005 | Cowens et al. |
| 6,879,041 B2 | 4/2005 | Yamamoto et al. |
| 6,882,030 B2 | 4/2005 | Siniaguine |
| 6,887,769 B2 | 5/2005 | Kellar et al. |
| 6,908,565 B2 | 6/2005 | Kim et al. |
| 6,908,785 B2 | 6/2005 | Kim |
| 6,917,119 B2 | 7/2005 | Lee et al. |
| 6,924,551 B2 | 8/2005 | Rumer et al. |
| 6,943,067 B2 | 9/2005 | Greenlaw |
| 6,946,384 B2 | 9/2005 | Kloster et al. |
| 6,958,539 B2 | 10/2005 | Lay et al. |
| 6,962,867 B2 | 11/2005 | Jackson et al. |
| 6,962,872 B2 | 11/2005 | Chudzik et al. |
| 6,975,016 B2 | 12/2005 | Kellar et al. |
| 7,008,867 B2 | 3/2006 | Lei |
| 7,012,333 B2 | 3/2006 | Shimoyama et al. |
| 7,030,481 B2 | 4/2006 | Chudzik et al. |
| 7,037,804 B2 | 5/2006 | Kellar et al. |
| 7,049,170 B2 | 5/2006 | Savastiouk et al. |
| 7,056,807 B2 | 6/2006 | Kellar et al. |
| 7,060,601 B2 | 6/2006 | Savastiouk et al. |
| 7,064,436 B2 | 6/2006 | Ishiguri et al. |
| 7,071,546 B2 | 7/2006 | Fey et al. |
| 7,087,538 B2 | 8/2006 | Staines et al. |
| 7,111,149 B2 | 9/2006 | Eilert |
| 7,122,912 B2 | 10/2006 | Matsui |
| 7,151,009 B2 | 12/2006 | Kim et al. |
| 7,157,787 B2 | 1/2007 | Kim et al. |
| 7,193,308 B2 | 3/2007 | Matsui |
| 7,215,033 B2 | 5/2007 | Lee et al. |
| 7,262,495 B2 | 8/2007 | Chen et al. |
| 7,271,497 B2 | 9/2007 | Joshi et al. |
| 7,276,799 B2 | 10/2007 | Lee et al. |
| 7,279,795 B2 | 10/2007 | Periaman et al. |
| 7,297,574 B2 | 11/2007 | Thomas et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,335,972 B2 | 2/2008 | Chanchani |
| 7,345,350 B2 | 3/2008 | Sinha |
| 7,355,273 B2 | 4/2008 | Jackson et al. |
| 7,391,112 B2 | 6/2008 | Li et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,462,942 B2 | 12/2008 | Tan et al. |
| 7,494,845 B2 | 2/2009 | Hwang et al. |
| 7,501,311 B2 | 3/2009 | Tsai |
| 7,528,494 B2 | 5/2009 | Furukawa et al. |
| 7,531,890 B2 | 5/2009 | Kim |
| 7,557,597 B2 | 7/2009 | Anderson et al. |
| 7,566,650 B2 | 7/2009 | Lin et al. |
| 7,576,435 B2 | 8/2009 | Chao |
| 7,592,246 B2 | 9/2009 | Akram |
| 7,648,899 B1 | 1/2010 | Banerji et al. |
| 7,825,511 B2 | 11/2010 | Daubenspeck et al. |
| 7,834,450 B2 | 11/2010 | Kang |
| 7,928,534 B2 | 4/2011 | Hsu et al. |
| 2001/0000321 A1 | 4/2001 | Takeda et al. |
| 2002/0014705 A1 | 2/2002 | Ishio et al. |
| 2003/0156969 A1 | 8/2003 | Choi et al. |
| 2003/0216025 A1 | 11/2003 | Lu et al. |
| 2001/0166661 | 8/2004 | Lei |
| 2005/0001324 A1 | 1/2005 | Dunn et al. |
| 2005/0077624 A1 | 4/2005 | Tan et al. |
| 2005/0179131 A1 | 8/2005 | Homma |
| 2006/0017160 A1 | 1/2006 | Huang |
| 2006/0043603 A1 | 3/2006 | Ranade et al. |
| 2006/0166402 A1 | 7/2006 | Lim et al. |
| 2006/0237842 A1 | 10/2006 | Shindo |
| 2006/0278982 A1 | 12/2006 | Solo |
| 2007/0023904 A1 | 2/2007 | Salmon |
| 2007/0080451 A1 | 4/2007 | Suh |
| 2007/0108606 A1 | 5/2007 | Watanabe |
| 2007/0284684 A1 | 12/2007 | Naito et al. |
| 2007/0287279 A1 | 12/2007 | Daubenspeck et al. |
| 2008/0296764 A1 | 12/2008 | Chang et al. |
| 2009/0011543 A1 | 1/2009 | Karta et al. |
| 2009/0026608 A1 | 1/2009 | Tsai et al. |
| 2009/0045511 A1 | 2/2009 | Meyer et al. |
| 2009/0096109 A1 | 4/2009 | Iwasaki |
| 2009/0098724 A1 | 4/2009 | Yu |
| 2009/0130840 A1 | 5/2009 | Wang et al. |
| 2009/0197114 A1 | 8/2009 | Shih et al. |
| 2009/0229857 A1* | 9/2009 | Fredenberg et al. ....... 174/126.2 |
| 2010/0090318 A1 | 4/2010 | Hsu et al. |
| 2010/0109159 A1 | 5/2010 | Ho et al. |
| 2010/0230810 A1 | 9/2010 | Kang et al. |
| 2011/0101523 A1 | 5/2011 | Hwang et al. |
| 2011/0101526 A1 | 5/2011 | Hsiao et al. |
| 2011/0156256 A1 | 6/2011 | Kang et al. |
| 2011/0186990 A1 | 8/2011 | Mawatari et al. |
| 2011/0227216 A1 | 9/2011 | Tseng et al. |
| 2011/0281432 A1 | 11/2011 | Farooq et al. |
| 2011/0291267 A1 | 12/2011 | Wang et al. |
| 2012/0126419 A1 | 5/2012 | Kripesh et al. |

OTHER PUBLICATIONS

Kim, K. J., et al., "Chemical Interaction, Adhesion and Diffusion Properties at the Interface of Cu and Plasma-Treated Thiophene-Based Plasma Polymer (ThioPP) Films", Thin Solid Films 398-399 (2001), pp. 657-662.

Du, M., et al., "The Interface Formation of Copper and Low Dielectric Constant Fluoro-Polymer: Plasma Surface Modification and its Effect on Copper Diffusion", Journal of Applied Physics, vol. 85, No. 3, Feb. 1, 1999, pp. 1496-1502.

Jiang, Liang-You, et al., "Reduced Copper Diffusion in Layered Silicate/Fluorinated Polyimide (6FDS-ODA) Nanocomposites", Journal of Applied Polymer Science, vol. 92, 1422-1425 (2004).

U.S. Appl. No. 61/258,414, filed Nov. 5, 2009, Chien Ling Hwang, et al.

U.S. Appl. No. 61/238,749, filed Sep. 1, 2009, Chung-Shi Liu.
U.S. Appl. No. 61/258,393, filed Nov. 5, 2009, Chien Ling Hwang, et al.

U.S. Appl. No. 61/230,012, filed Jul. 30, 2009, Chung-Shi Liu, et al.

* cited by examiner

US 8,546,254 B2

MECHANISMS FOR FORMING COPPER PILLAR BUMPS USING PATTERNED ANODES

RELATED APPLICATIONS

The present application is related to U.S. provisional Application No. 61/258,393, entitled "Copper Pillar Bump with Barrier Layer for Reducing The Thickness of Intermetallic Compound," filed on Nov. 5, 2009, and U.S. application Ser. No. 12/702,636, entitled "Semiconductor Device And Semiconductor Assembly With Lead-Free Solder," filed on Feb. 9, 2010. Both above-mentioned applications are incorporated herein by reference in their entirety.

TECHNICAL FIELD

This disclosure relates to the fabrication of integrated circuit devices, and more particularly, to the fabrication of bump structures in integrated circuit devices.

BACKGROUND

Modern integrated circuits are made of literally millions of active devices, such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads (or input/output "I/O" pads) are formed and exposed on the surface of the respective chip. Electrical connections are made through bond pads to connect the chip to a package substrate or another die. Bond pads can be used for wire bonding or flip-chip bonding.

Flip-chip packaging utilizes bumps to establish electrical contact between a chip's I/O pads and the substrate or lead frame of the package. Structurally, a bump actually contains the bump itself and a so-called under bump metallurgy (UBM) layer located between the bump and an I/O pad. For example, an UBM layer may contain an adhesion layer, a barrier layer and a wetting layer, arranged in this order on the I/O pad. The bumps themselves, based on the material used, can be classified as solder bumps, gold bumps, copper pillar (or copper post) bumps and bumps with mixed metals. Recently, copper pillar (or copper post) bump technology has emerged. Instead of using solder bump, an electronic component is connected to a substrate by means of copper pillar bumps, which achieve finer pitches with minimum probability of bump bridging, reduces the capacitance load for the circuits, and allows the electronic component to perform at higher frequencies. It is within this context the following disclosure arises.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION

Figure 1A:
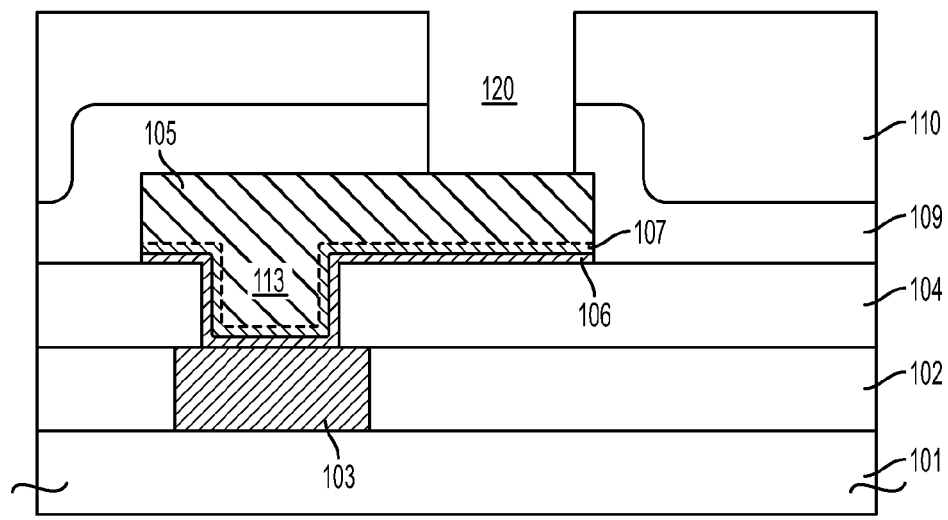
FIGS. 1A-1C illustrate cross-sectional diagrams of a Cu pillar (or Cu post) bump process, in accordance with some embodiments.

It is to be understood that the following disclosure provides many different embodiments, or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIGS. 1A-1D illustrate cross-sectional diagrams of a Cu pillar (or Cu post) bump process, in accordance with some embodiments. FIG. 1A shows a bump fabrication region 100, in accordance with some embodiments. The bump fabrication region 100 is formed on a semiconductor substrate 101. The semiconductor substrate 101 is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 101 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Substrate 101 may also include inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers.

FIG. 1A also shows a top metallization layer 103 formed in a top-level inter-layer dielectric layer 102, in accordance with some embodiments. Suitable materials for the top metallization layer 103 may include, but are not limited to, for example copper (Cu), aluminum (Al), AlCu, copper alloy, or other conductive materials. As mentioned above, the top metallization layer 103 is used in the bonding process to connect the integrated circuits in substrate 101 to external features.

FIG. 1A also illustrates a passivation layer 104 formed over the top-level inter-layer dielectric layer 102 and the top metallization layer 103. In some embodiments, the passivation layer 104 is formed of a non-organic material selected from un-doped silicate glass (USG), silicon nitride, silicon oxynitride, silicon oxide, and combinations thereof. In another embodiment, the passivation layer 104 is formed of a polymer layer, such as an epoxy, polyimide, benzocyclobutene (BCB), polybenzoxazole (PBO), and the like, although other relatively soft, often organic, dielectric materials can also be used.

The passivation layer 104 is patterned and etched to create an opening 113 to make contact with the top metallization layer 103. The opening 113 is filled with an adhesion layer 106, which helps the conductive layer deposited layer to adhere to the passivation layer 104. Examples of materials that can be used for adhesion layer 106 include titanium, titanium nitride, tantalum, tantalum nitride, and combinations thereof. The adhesion layer 106, also referred to as a glue layer, is blanket formed, covering the passivation layer 104 and the sidewalls and the bottom of opening 113. The adhesion layer 106 can be formed by physical vapor deposition (or sputtering), and the like.

After the deposition of the adhesion layer 106, the opening 113 is filled with a post passivation interconnect (PPI) layer 105, which extends above the opening 113 and can also be called a pad layer. The material used for the PPI layer 105 may include, but is not limited to, for example copper, aluminum, copper alloy, aluminum alloy, or other mobile conductive materials. If the PPI layer 105 is made of copper, the adhesion layer 106 also serves the purpose of copper diffusion barrier. The exemplary materials that can be used for adhesion layer 106 described above, such as titanium, titanium nitride, tantalum, tantalum nitride, and combinations thereof, can also provide the function of a copper diffusion barrier. In addition, if the PPI layer 105 is made of copper and the copper layer (105) is deposited by plating, a Cu seed layer 107 is deposited on the adhesion layer 106, in accordance with some embodiment. The materials that can be used as the seed layer 107 include copper or copper alloys, and metals such as silver, gold, aluminum, and combinations thereof may also be included. The seed layer 107 may also include aluminum or aluminum alloys. In some embodiments, the seed layer is formed of sputtering (or physical vapor deposition). In other embodiments, electroless plating may be used.

The PPI layer 105 may be formed by electrochemical plating, electroless plating, sputtering, chemical vapor deposition, and the like. After the PPI layer 105 is deposited, the PPI layer 105 is patterned and etched to define the PPI line. The PPI line (or pad line) 105 connects the top metallization layer 103 to bump features. The PPI line 105 may also function as power lines, re-distribution lines (RDL), inductors, capacitors or any passive components. The PPI line 105 may have a thickness less than about 30 μm, for example between about 2 μm and about 25 μm. Then the exposed portions of the layer 106 and layer 107, if applicable, are removed. The removal step may include a wet etching process or a dry etching process. In one embodiment, the removal step includes an isotropic wet etching using an ammonia-based acid, which may be a flash etching with a short duration.

Next, a dielectric layer 109, also referred to as an isolation layer or a passivation layer, is formed on the exposed passivation layer 104 and the PPI line 105. The dielectric layer 109 may be formed of dielectric materials such as silicon nitride, silicon carbide, silicon oxynitride or other applicable materials. The formation methods include plasma enhance chemical vapor deposition (PECVD) or other commonly used CVD methods. A polymer layer 110 is formed on the dielectric layer 109 through the steps of coating, curing, descum and the like. Lithography technology and etching processes such as a dry etch and/or a wet etch process are then performed to pattern the polymer layer 110, thus an opening 120 is formed to pass through the polymer layer 110 and the dielectric layer 109 and expose a portion of the PPI line 105 for allowing subsequent bump processing. In some embodiments, the dielectric layer 109 is etched before the polymer layer 110 is deposited and patterned.

The polymer layer 110, as the name suggests, is formed of a polymer, such as an epoxy, polyimide, benzocyclobutene (BCB), polybenzoxazole (PBO), and the like, although other relatively soft, often organic, dielectric materials can also be used. In some embodiments, the polymer layer 110 is a polyimide layer. In some other embodiments, the polymer layer 110 is a polybenzoxazole (PBO) layer. The polymer layer 110 is soft, and hence has the function of reducing inherent stresses on the respective substrate. In addition, the polymer layer 110 is easily formed to thickness of tens of microns.

Figure 1B:
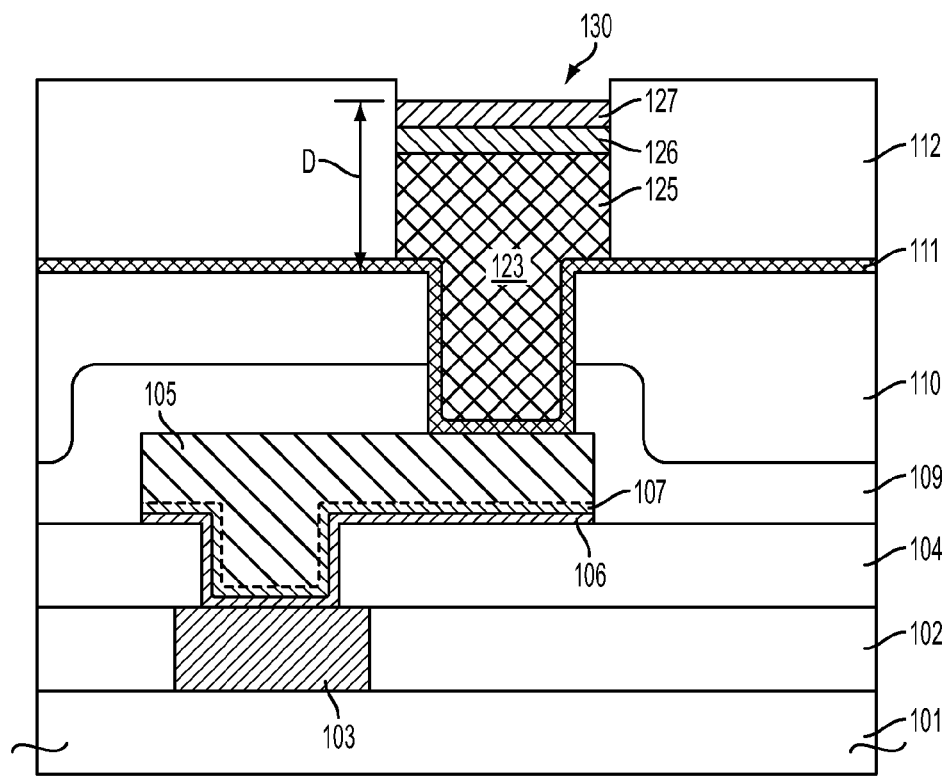

Referring to FIG. 1B, the formation of an under-bump-metallurgy (UBM) layer 111 that includes a diffusion barrier layer and a seed layer is performed on the resulted structure of FIG. 1A, in accordance with some embodiments. The UBM layer 111 is formed on the polymer layer 110 and the exposed portion of the PPI line 105, and lines the sidewalls and bottom of the opening 120. The diffusion barrier layer, also referred to as a glue layer, is formed to cover the sidewalls and the bottom of the opening 120. The diffusion barrier layer may be formed of tantalum nitride, although it may also be formed of other materials such as titanium nitride, tantalum, titanium, or the like. In some embodiments, the formation methods include physical vapor deposition (PVD) or sputtering. The seed layer may be a copper seed layer formed on the diffusion barrier layer. The seed layer may be formed of copper alloys that include silver, chromium, nickel, tin, gold, and combinations thereof. In some embodiments, the UBM layer 111 includes a diffusion barrier layer formed of Ti and a seed layer formed of Cu. In some embodiments, both the diffusion barrier layer, such as a Ti layer, and the seed layer, such as a Cu layer, are deposited by physical vapor deposition (PVD) or sputtering methods.

Next, a mask layer 112 is provided on the UBM layer 111 and patterned with an opening 123 exposing a portion of the UBM layer 111 for Cu pillar bump formation. In some embodiments, the opening 123 is over the opening 120. In some other embodiments, the diameter of the opening 123 is greater or equal to the diameter of the opening 120. In some embodiments, the size of the opening 123 is between about 5 μm to about 100 μm. The mask layer 112 may be a dry film or a photoresist film. The opening 123 is then partially or fully filled with a conductive material with solder wettability. In an embodiment, a copper (Cu) layer 125 is formed in the opening 123 to contact the underlying UBM layer 111. The copper layer 125 protrudes above the surface of the polymer layer 110 with a thickness "D". In some embodiments, the thickness "D" is between about 2 μm to about 100 μm.

As used throughout this disclosure, the term "copper (Cu) layer" is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. For example, electro-chemical plating (ECP) is carried out to form the Cu layer 125. In some embodiments, the thickness of the Cu layer 125 is greater than 30 μm. In some other embodiments, the thickness of the Cu layer 125 is greater than 40 μm. For example, the Cu layer 125 may be of about 40~50 μm thickness, or about 40~70 μm thickness, although the thickness may be greater or smaller.

Afterwards, a cap layer 126 is formed on the top surface of the Cu pillar (or post) 125. The cap layer 126 could act as a barrier layer to prevent copper in the Cu pillar 125 from diffusing into bonding material, such as solder alloy, that is used to bond the substrate 10 to external features. The prevention of copper diffusion increases the reliability and bonding strength of the package. The cap layer 126 may include nickel, tin, tin-lead (SnPb), gold (Au), silver, palladium (Pd), indium (In), nickel-palladium-gold (NiPdAu), nickel-gold (NiAu), other similar materials, or alloy. In some embodiments, the cap layer 126 is a nickel layer with a thickness about 1~5 μm. In some embodiments, the cap layer 126 is formed by plating.

Afterwards, a lead-free (Pb-free) solder layer 127 is formed on the cap layer 126. Thus the lead-free solder layer 127, the cap layer 126, and the Co pillar 125 are referred to as a bump structure 130 formed over the pad region 105. The lead-free (Pb-free) solder layer 127 may be formed by plating. In some embodiments, the lead-free solder layer 127 is formed as solder ball on the cap layer 126. In some other embodiments, the lead-free solder layer 127 is a plated solder layer on the cap layer 126. For a lead-free solder system, the solder layer 127 is SnAg with Ag content being controlled lower than 1.6 weight percent (wt %), in accordance with some embodiments. FIG. 1B shows that both the lead-free solder layer 127 and the cap layer 126 are plated in the opening formed by photoresist 112.

Figure 1C:
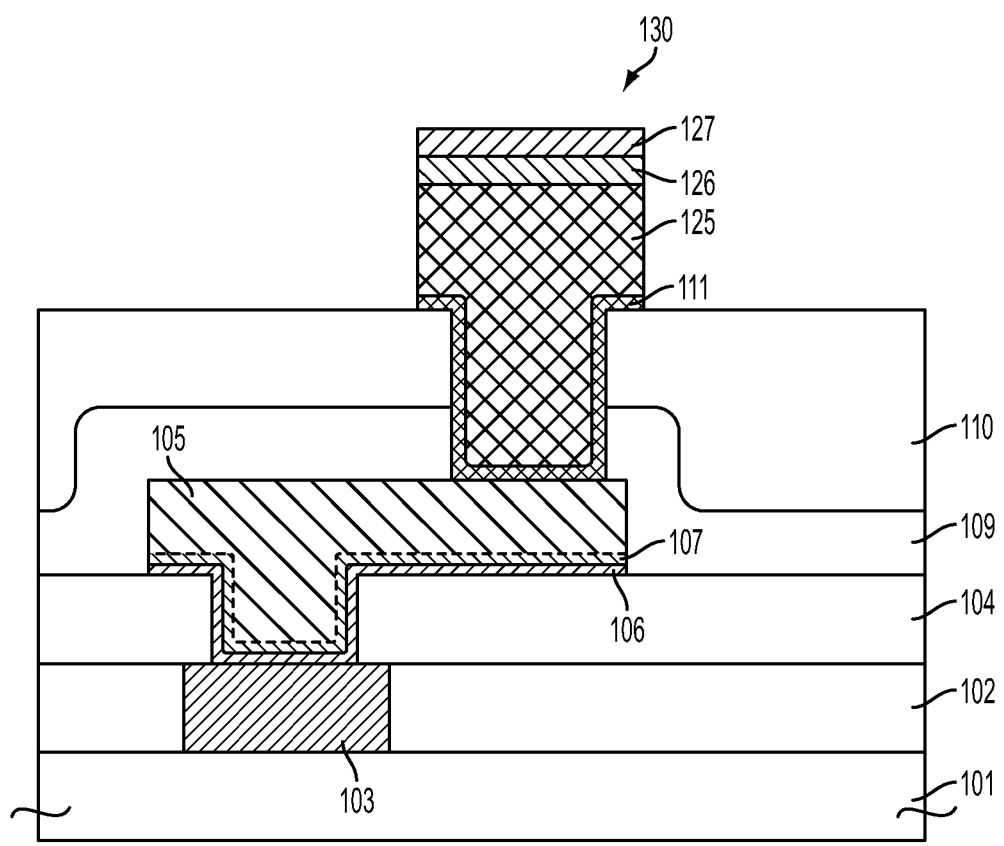

After the deposition of the lead-free solder layer 127, the cap layer 126, and the copper pillar 125, the photoresist layer 112 is removed. Following the removal of the photoresist layer, UBM layer 111 that is exposed (not under the bump structure 130 is removed by etching. The etching process can be a dry process or a wet process. FIG. 1C shows the bump structure 130 after the photoresist layer 112 and the exposed UBM layer 111 are removed, in accordance with some embodiments. In some embodiments, the lead-free solder layer 127 is reflowed to change its shape.

The process sequence described above requires photoresist coating, lithographical exposure, and development of exposed photoresist layer 112. After plating of the copper pillar 125, the cap layer 126, and the lead-free solder layer 127, the photoresist layer 112 is removed. After the removal of the photoresist layer 112, the substrate needs to be cleaned, also called "descummed," to remove any trace of photoresist from the substrate surface. The photoresist patterning and cleaning are required for each substrate, which result in high processing cost and low substrate throughput. In addition, the within die (WID) and within wafer (WIW) uniformity could be poor due to uneven electric field caused by varying pattern density across the substrate. Therefore, it is desirable to find processing alternatives to reduce processing cost, to increase substrate throughput, and to improve WID and WIW uniformities.

Figure 2A:
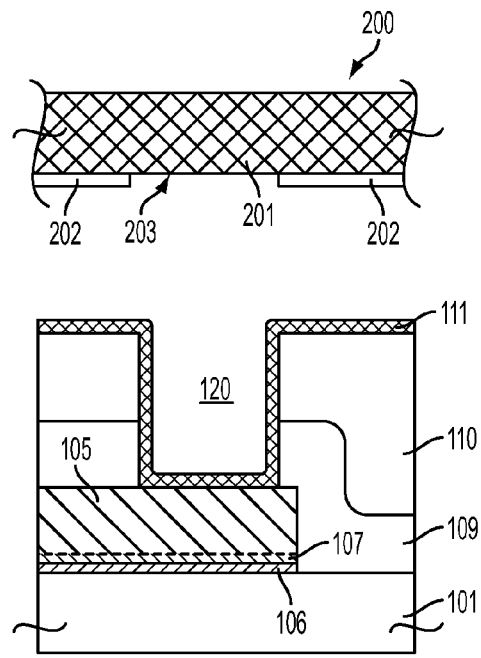
FIGS. 2A-2D illustrate cross-sectional diagrams of a Cu pillar (Cu post) bump process, in accordance with some embodiments.

FIGS. 2A-2D illustrate cross-sectional diagrams of a Cu pillar (Cu post) bump process, in accordance with some embodiments. FIG. 2A shows a portion of cross sectional diagram of FIG. 1A after the post passivation interconnect (PPI) layer 105 is deposited and patterned and also after UBM layer 111 is deposited. The semiconductor substrate 101 is placed in an electrochemical plating (ECP) bath (not shown) with an anode over 200 substrate 101. In some embodiments, anode 200 is made of a metal 201 and is covered with a patterned and non-conductive layer 202. In some embodiments, the non-conductive layer 202 is first deposited on the anode 200 and then patterned to expose conductive areas, such as area 203, above copper pillar (or post) openings, such as opening 120. In some other embodiments, the patterned and non-conductive layer 202 is a separate from metal 201 and is a mask, which is removable from the anode. For different patterns on the substrates, different masks (with same or different patterns) can be used. The patterned and non-conductive layer 202 can be made of any non-conductive (or dielectric) material, such as oxide, nitride, oxynitride, etc. In some embodiments, the dielectric (or non-dielectric) layer 202 is deposited by CVD, PECVD, or a spin-on process. In some embodiments, the thickness of the non-conductive layer is between about 1 mm to about 10 cm.

In some embodiments, anode 200 is made of the metal 201 to be plated on the conductive surface of substrate 101 directly underneath the anode 200, as shown in FIG. 2A. For example, if the metal being deposited on the conductive surface (UBM layer 111 surface) of substrate 101 is copper, the metal 201 is copper. Similarly, if other types of metal were plated, other types of metal would be used for metal 201 of anode 200.

Alternatively, the source of metal deposited on the surface of UBM layer 111 can come from elsewhere, such as from the plating solution, or another solid metal source (not shown) immersed in the solution. Under such circumstances, metal 201 is made of a metal that does not dissolve with plating and does not oxidize easily in the plating solution (i.e. metal 201 being inert to the plating solution). For example, metal 201 can be made of Pt when a copper film is being plated on substrate 101.

Portions of anode 200 are covered by a photoresist layer 202, which can be a dry or a wet photoresist. The pattern of photoresist 202 matches (or correlates) with the pattern on substrate 101 with metal layer 201 facing the opening 120 (which is lined with UBM layer 111), as shown in FIG. 2A. Substrate 101 and anode 200 are surrounded by a plating liquid (not shown). Substrate 101 can be disposed on a substrate holder (not shown). To initiate plating, a voltage is applied between the anode 200 and the substrate 101, in accordance with some embodiments. In the exemplary plating system shown in FIG. 2A, the anode 200 is above the substrate (or the cathode) 101. In some embodiments, the anode 200 and the substrate 101 are placed side by side and are parallel to each other.

Figure 2B:
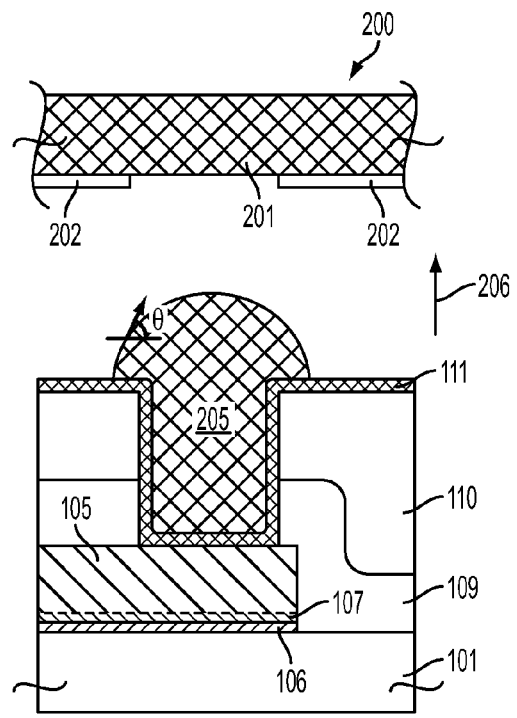
Figure 2C:
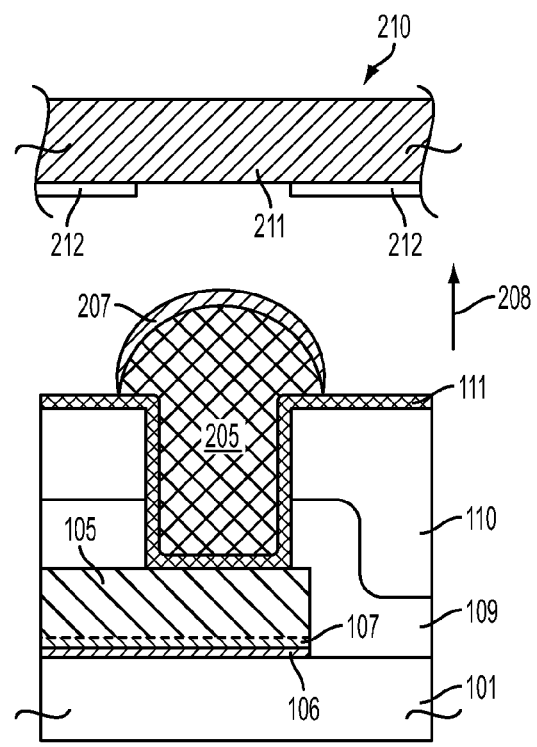
Figure 2D:
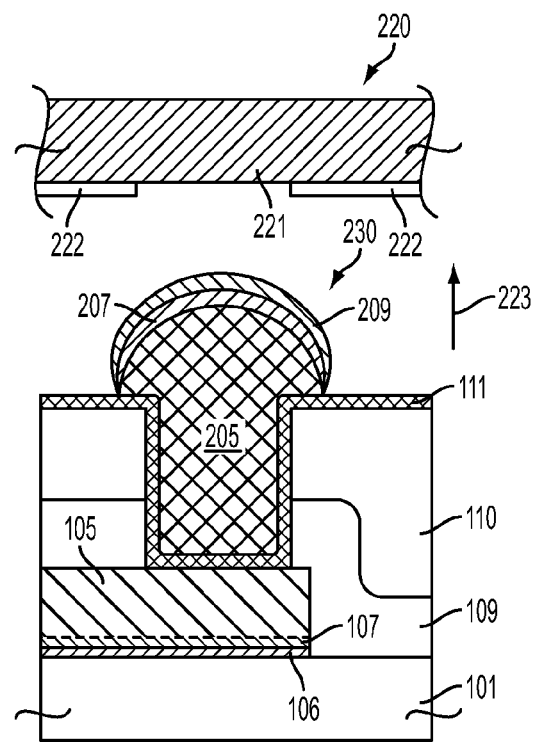

To simplify description of embodiments, copper is used to fill opening 120. However, as mentioned above, other types of metal can be used. FIG. 2B shows a copper film 205 being deposited to fill the opening 120 under the exposed copper 201 on anode 200, in accordance with some embodiments. In some embodiments, the electric field between the anode 200 and the substrate 101 causes copper to be dissolved at the exposed copper 201 and be deposited on the surface of UBM layer 111 directly underneath the exposed copper 201. Equations (1) and (2) show the reactions at anode and at the cathode (or substrate 101).

At Anode:

$$Cu \rightarrow Cu^{2+} + 2e^-  \quad (1)$$

At Cathode:

$$Cu^{2+} + 2e^- \rightarrow Cu \quad (2)$$

In some embodiments, as the copper film 205 is deposited, the anode 200 is pulled away from the substrate 101 in direction 206. The speed of pulling the anode 200 away from substrate 101 can affect the shape of film 205. In some embodiments, the faster the pulling rate, the higher the tangential angle "θ" of the surface of the copper layer 205. In some embodiments, the pulling rate is not a constant and varies with deposition time. Alternatively, substrate 101 can be pulled away from the anode, instead of the anode being pulled away from substrate. In addition to the pulling rate of the anode 200, the voltage difference between the anode 200 and the cathode (substrate 101) and the chemistry of the plating bath can also affect the shape of copper layer 205. In some embodiments, the voltage of ECP for copper is between about 0.1 V to about 10V.

Substrate 101 is placed on a substrate holder (not shown) and acts as a cathode. In some embodiments, the distance between the anode 200 and the substrate 101 is kept between about 0.1 mm to about 100 mm (or 10 cm). The copper plating bath may include a number of chemicals including copper ion supplier, such as copper sulfate ($CuSO_4$), electrically conductive agent, such as sulfuric acid ($H_2SO_4$), and anode dissolution agent, such as hydrochloric acid (HCl, also acts as a brightener), and additives. Examples of additives include surfactant, brightener, and leveler. In some embodiments, the plating rate is between about 0.01 μm/min to about 6.0 μm/min. In some embodiments, the anode-pulling rate and/or the plating voltage are adjusted throughout the deposition cycle to modify the deposition rate and the profile of copper layer 205. In some embodiments, the pulling rate (or separating rate between the anode and the substrate) is between about 0.01 μm/min to about 1 cm/min.

After copper layer 205 is formed, substrate 101 is removed from the copper-plating bath. In some embodiments, substrate 101 is then rinsed to remove residual copper plating solution. The substrate is then placed in another plating bath with a patterned anode 210 to deposit another layer 207 with a cap layer material. To simplify description of the process, the exemplary cap layer material used is Ni. The anode 210 has a photoresist layer 212 and has a pattern similar to the pattern on anode 200, in accordance with some embodiments. In some embodiments, anode 210 has a metal layer 211, which can be made of plating metal or a non-plating metal. For example, if Ni is to be plated, metal layer 211 can be made of Ni or a non-Ni metal. The plating of a Ni layer 207 over the copper layer 205 is very similar to the plating of the copper layer 205. In some embodiments, anode 210 is pulled away from substrate 101 during plating, and the profile of Ni layer 207 is controlled by the pulling speed of anode 210 and by the voltage of plating, etc. Equations (3) and (4) show the reactions at anode and at the cathode (or substrate 101).

At Anode:

$$Ni \rightarrow Ni^{2+} + 2e^- \quad (3)$$

At Cathode:

$$Ni^{2+} + 2e^- \rightarrow Ni \quad (4)$$

As the copper film 207 is deposited, the anode 210 is pulled away from the substrate 101 in direction 208. The speed of pulling the anode 210 can affect the shape of film 207. The faster the pulling rate, the higher the tangential angle of the surface of the nickel layer 207. Alternatively, substrate 101 can be pulled away from the anode, instead of anode being pulled away from the substrate. In addition to the pulling rate of the anode 210, the voltage difference between the anode 210 and the cathode (substrate 101) and the chemistry of the plating bath can also affect the shape of Ni layer 207. In some embodiments, the voltage of ECP for copper is between about 0.1 V to about 10V.

In some embodiments, substrate 101 is placed on a substrate holder (not shown) and acts as a cathode. In some embodiments, the distance between the anode 210 and the substrate 101 is kept between about 0.1 mm to about 10 cm. The Ni plating bath may include a number of chemicals including Ni ion supplier, such as nickel sulfamate (Ni$(SO_3NH_2)_2$), pH buffer, such as boric acid ($H_3BO_3$), anode dissolution agent, such as nickel chloride ($NiCl_2$), and other additives. Examples of additives include surfactant, brightener, leveler, and anti-pit reagent, etc. In some embodiments, the plating rate is between about 0.01 μm/min to about 6.0 μm/min. In some embodiments, the anode pulling rate and the plating voltage can be adjusted throughout the deposition cycle to modify the profile of copper layer 207. In some embodiments, the pulling rate (or separating rate between the anode and the substrate) is between about 0.01 μm/min to about 1 cm/min.

After copper layer 207 is formed, substrate 101 is removed from the nickel-plating bath. In some embodiments, substrate 101 is then rinsed to remove residual copper plating solution. The substrate is then placed in a lead-free (SnAg) solder plating bath with a patterned anode 220 to deposit a lead-free solder layer 209. The plating process for lead-free solder layer and anode 220 designed are similar to those for Cu layer 205 and Ni layer 207. Similarly, the profile of lead-free layer 209 is controlled by the pulling speed of anode 220 and by the voltage of plating, in accordance with some embodiments. Similarly, when the lead-free solder layer 209 is deposited, the anode 220 is pulled away from the substrate 101 in direction 223, in accordance with some embodiments. The speed of pulling the anode 220 can affect the shape of film 209. Alternatively, substrate 101 can be pulled away from the anode, instead of the anode being pulled away from the substrate. In some embodiments, the voltage of ECP for lead-free solder layer 209 is between about 0.1 V to about 10V. In some embodiments, the plating rate is between about 0.01 μm/min to about 6.0 μm/min. In some embodiments, the pulling rate (or separating rate between the anode and the substrate) is between about 0.01 μm/min to about 1 cm/min.

By patterning the anodes, the processing sequence is simpler and has lower cost, since there is no need to pattern each substrate. Each patterned anode can be used to plate many substrates. For different products, a different mask (removable mask) can be place on the anode. In addition, each processed substrate does not need to undergo photoresist patterning, photoresist removing, and substrate cleaning, etc. Further, since the anode is patterned, the electric field between the patterned anode and the substrate is more uniform than the electric field between the traditional anode and substrate. As a result, the within wafer (WIW) and within die (WID) thickness uniformity is better.

In addition to the above-mentioned benefits, patterned anodes can also form bumps with different heights. As mentioned above, flip-chip packaging utilizes bumps to establish electrical contact between a chip's I/O pads and the substrate or lead frame of the package. In some embodiments, the substrate where the chip with bumps is placed could have an uneven surface. For example, the surface of the substrate has conductive elements that have different heights. As a result, the bumps on the chip (for flip-chip application) need to have different heights to accommodate the varying heights of the conductive elements on the substrate.

Figure 3A:
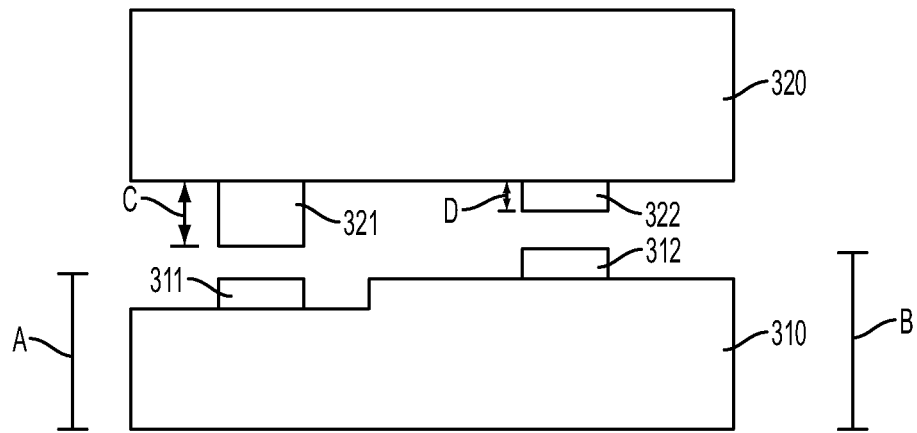
FIG. 3A shows two semiconductor chips with bump structures facing one another, in accordance with some embodiments.

FIG. 3A shows two semiconductor chips 310 and 320 with bump structures, 311, 312, 321, and 322 facing one another, in accordance with some embodiments. Bump 311 would be connected to bump 321 and bump 312 would be connected to bump 322 to provide connection (electrical and also possibly thermal) between chips 310 and 320. Different devices and structures can exist in chips 310 and 320. Due to uneven surface of chip 310, bump 311 has a height "A" and bump 312 has a height "B" from the bottom surface of chip 311. Height "B" is larger than height "A". To accommodate the different heights of bump 311 and 312, bump 321 has a height "C" that is larger than the height "D" of bump 322.

Figure 3B:
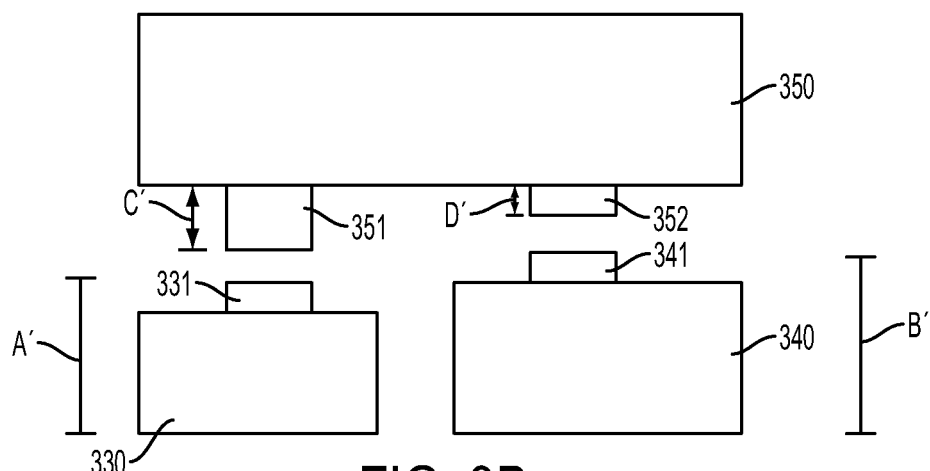
FIG. 3B shows a semiconductor chip being placed over two semiconductor chips, in accordance with some embodiments.

FIG. 3B shows a semiconductor chip 350 being placed over two semiconductor chips 330 and 340, in accordance with some embodiments. Bump 331 of chip 330 would be connected to bump 351 of chip 350 and bump 341 of chip 340 would be connected to bump 352 of chip 350. Chip 330 has a different height (or thickness) than chip 340. As a result, bump 331 is at a height A' and bump 341 is at a height of B'. To accommodate the different heights of chip 330 and chip 340, bump 351 and bump 352 of chip 350 have different height C' and D' respectively. The height of C' for bump 351 is higher than height D' for bump 352 to accommodate the lower height A' of bump 331 in comparison to height B' of bump 341.

Figure 4A:
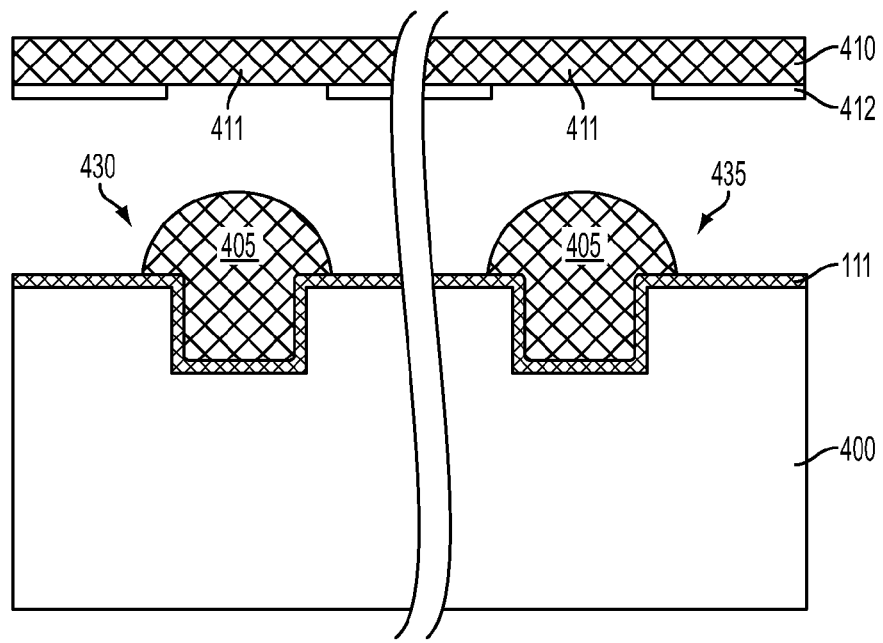
FIGS. 4A-4D shows cross-sectional diagrams of a process of a substrate being plated with material layers, in accordance with some embodiments.
Figure 4B:
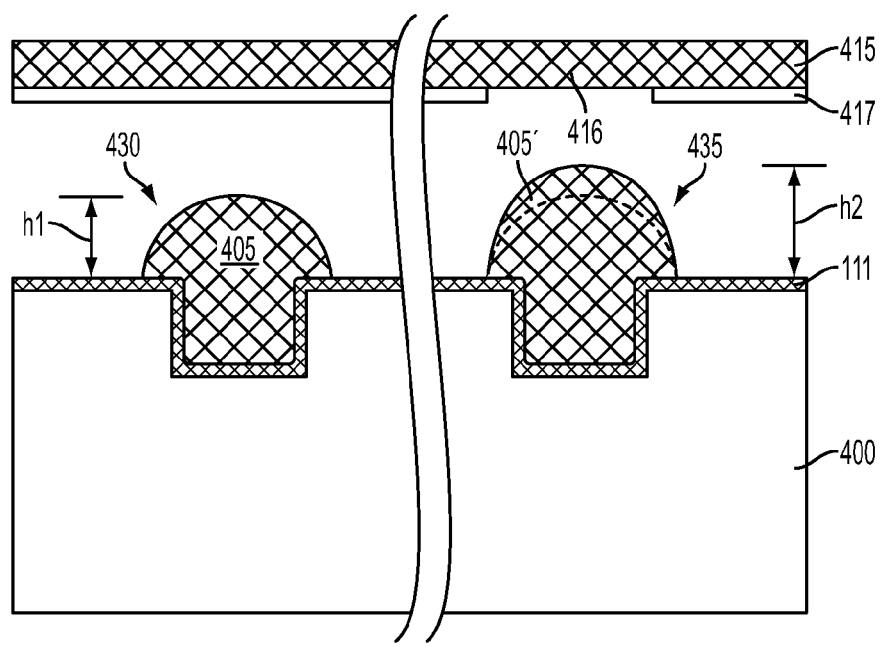

The process sequence described in FIGS. 1A-1C produces bumps on a substrate at the same height. However, pattern anodes can be used to produce bumps on a substrate with varying heights. FIGS. 4A-4D shows cross-sectional diagrams of a process of a substrate being plated with material layers, in accordance with some embodiments. FIG. 4A shows a substrate 400 with two bump structures 430 and 435 after a conductor layer 405 has been plated. In some embodiments, substrate 400 is similar to substrate 101 described in FIGS. 2A and 2B. The conductive layer 405 is a copper layer, in accordance with some embodiments. The anode 410 used to plate substrate 400 is patterned with a photoresist layer 412 leaving openings 411. Openings 411 face the openings of bump structures 430 and 435. The bump structures 430 and 435 are lined with an UBM layer 111. The heights of bump 430 and 435 after the plating are about the same, as shown in FIG. 4A. Afterwards, substrate 400 undergoes another plating with a different anode 415. Anode 415 has a different pattern from anode 410. The photoresist layer 417 of anode 415 leaves only openings above some bumps, such as bump 435, while covering the surface of anode 415 above other bumps, such as bump 435. FIG. 4B shows the opening 416 is above bump 435. After plating, bump 435 has a thicker metal layer 405', in comparison to metal layer 405. By using multiple plating with anodes with different patterns, bumps can be formed with different heights. FIG. 4B shows that bump 430 has a height "h1" for metal layer 405 and a height "h2" for metal layer 405'. Height h2 is larger (or taller) than height h1. Both metal layer 405 and metal layer 405' are made of the same material. The plating bath used to deposit additional thickness can be the same bath used for the first plating. Alternatively, a different (or new) bath can be used.

Figure 4C:
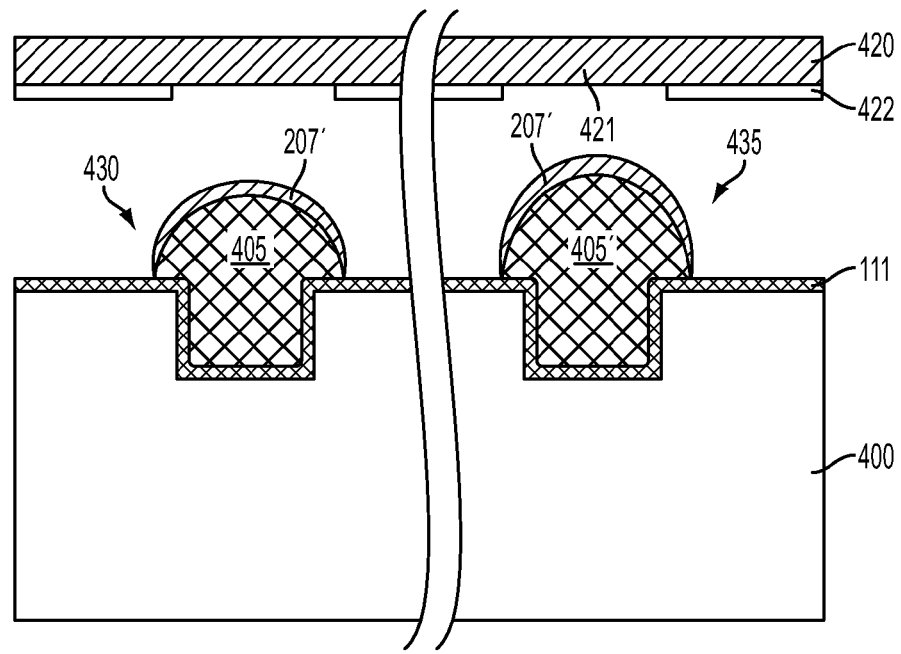
Figure 4D:
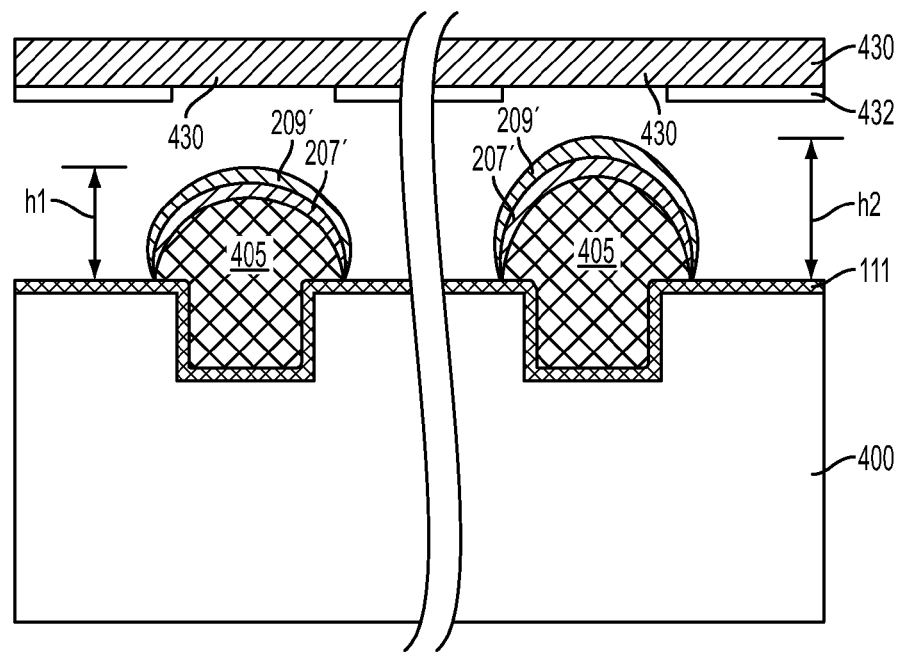

Afterwards, substrate 400 undergoes plating of a cap layer 207' as shown in FIG. 4C, in accordance with some embodiments. The patterned anode 420 used to plating the cap layer 207' is similar to the patterned anode 210 of FIG. 2C. A photoresist layer 422 covers portions of the anode 420 leaving openings 421 above bumps, such as bumps 430 and 435.

Afterward the deposition of the cap layer 207', substrate 400 undergoes plating of a lead-free solder layer 209' as shown in FIG. 4C, in accordance with some embodiments. The patterned anode 430 used to plating the lead-free solder layer 209' is similar to the patterned anode 220 of FIG. 2D. A photoresist layer 432 covers portions of the anode 430 leaving openings 431 above bumps, such as bumps 430 and 435. At the end of plating, bump 430 has a height H1 and bump 435 has a height H2 above the substrate surface. Height H2 is larger than height H1.

The bump structures prepared by the embodiment of the method described above have two different heights, h1 versus h2, or H1 versus H2. Bump structures with more than two types of heights can be prepared by extending the method described above. For example, the first metal layer can be plated more than two times to create bumps with differing heights. In additional, the second metal layer and the third metal layer can also undergo multiple plating operations to create different heights.

Figure 5A:
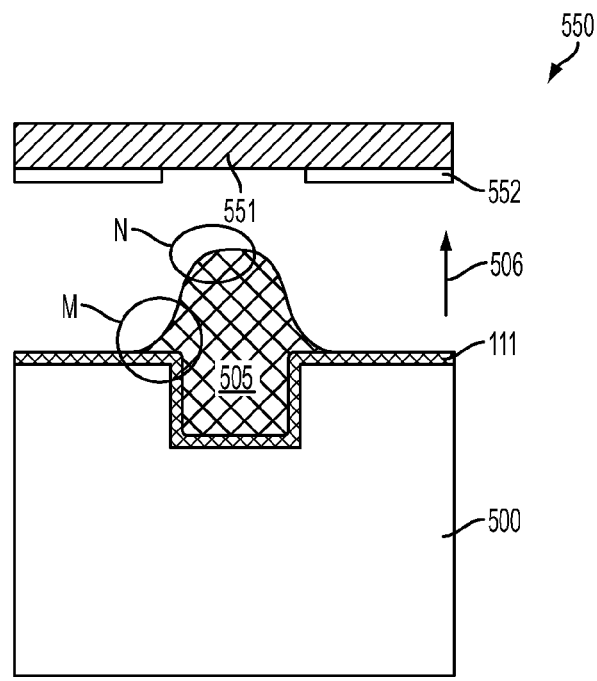
FIG. 5A shows a plating metal layer with convex shape in the beginning of deposition and with concave shape at the end of deposition, in accordance with some embodiments.

The contours of the plated metal layers described above by using patterned anodes are all concave shapes facing down. However, the contours of the plating metal layers are not necessary such shapes. As mentioned above, the rate of the anode and the cathode being pulled apart and other processing parameters can also affect the shapes of the contours. Therefore, other shapes of plating metal layers are also possible. FIG. 5A shows a plating metal layer 505 with convex shape in the beginning of deposition (region M) and with concave shape at the end of deposition (region N), in accordance with some embodiments.

Figure 5B:
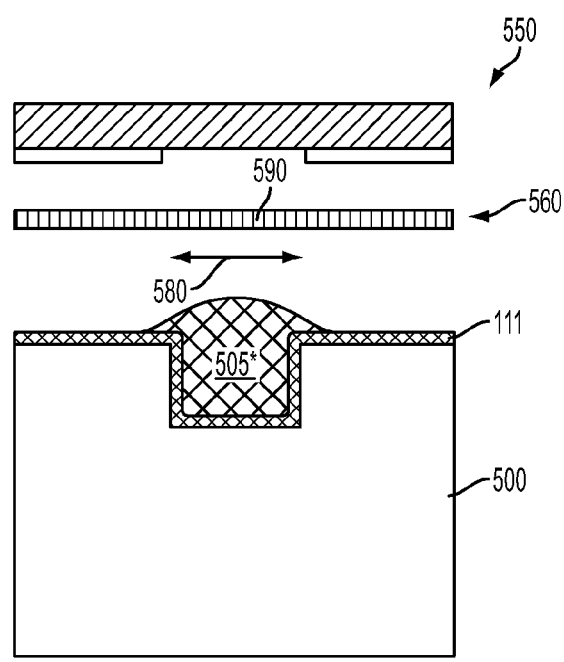
FIG. 5B shows a screen between an anode and a substrate, in accordance with some embodiments.

By controlling the speed the anode is being pulled in direction 506 (away from substrate 500), or the speed the cathode (the substrate) is being pulled in the opposite direction of direction 506, the shape (or contour) of the bumps can be modified. In addition to the pulling speed, current density can also affect the deposition rate and the shape of the bump(s). Current density can be affected by a number of factors, including voltage applied. Other factors can also affect the deposition rate and profile. For example, the metal ion (such as $Cu^{++}$ for copper plating) concentration in the plating bath and plating bath refreshing rate can be factors. In addition, the uniformity of the plating bath can also play a role. In some embodiments, between the anodes, such as anodes 200, 210, 220, 410, 415, 420, 430, and 550, and the substrates, such as substrate 110, 400, and 500, below each of the substrates, there can be a screen (with openings to allow fluid to flow through). Such screen can be moved in a repeated manner (such as up and down, or right and left) to stir up the plating liquid to improve its uniformity. The oscillating rate of the screen can affect the uniformity of the plating bath between the anode and the substrate; therefore, the oscillating rate can also impact deposition rate and deposition profile. FIG. 5B shows a screen 560 between anode 550 and substrate 500, in accordance with some embodiments. FIG. 5B shows that the screen 560 oscillates in a direction 580 parallel to both surfaces of anode 550 and substrate 500, in accordance with some embodiments. Screen 560 has paths (or openings 590) that allow plating liquid to go through. The oscillating movement of screen 560 stirs up the plating liquid between anode 550 and substrate 500 and improves the plating bath chemical uniformity.

The mechanisms of preparing bump structures described above by using patterned anodes may simplify the bump-making process, reduce manufacturing cost, and improve thickness uniformity within die and across the wafer. In addition, the mechanisms described above allow forming bumps with different heights to allow bumps to be integrated with elements on a substrate with different heights. Bumps with different heights expand the application of copper post bumps to enable further chip integration.

In one embodiment, a method of making a plurality of bump structures on a substrate is provided. The method includes immersing a substrate in a first plating bath, and the substrate is coupled to a cathode. The method also includes plating a first metal layer on openings of the plurality of bump structures. The openings are lined with an under bump metallurgy (UBM) layer, and the first metal layer is part of the plurality of bump structures. A first anode in the first plating bath is patterned to deposit the first metal layer in the openings of the plurality of bump structures.

In another embodiment, a method of making a plurality of bump structures with different heights on a substrate is provided. The method includes immersing a substrate in a first plating bath, and the substrate is coupled to a cathode. The method also includes plating a first metal layer on openings of the plurality of bump structures, and the first metal layer is made of a first metal. The first metal layer is part of the plurality of bump structures, and a first anode in the first plating bath is patterned to deposit the first metal layer in the openings of the plurality of bump structures. The method further includes plating a second metal layer on a portion of the plurality of bump structures, and the second metal layer is also made of the first metal. The second metal layer is part of portion of the plurality of bump structures, and a second anode is used to plate the second metal layer and the second anode is patterned to deposit the second metal layer on the in the openings of the portion of the plurality of bump structures. The portion of the plurality of bump structures deposited with the second metal layer has higher thickness than the other portion not deposited with the second metal layer.

In another embodiment, a bump structure on a substrate is provided. The bump structure includes a copper layer, and the copper layer fills an opening created in the dielectric layer and the polymer layer. An under-bump-metallurgy (UBM) layer lines the opening and the copper layer is deposited over the UBM layer, and a surface of the copper layer facing away from the substrate is curved and is not linear.

In yet another embodiment, two bump structures with different heights on a substrate are provided. The two bump structures includes a first bump with a copper layer with a first thickness, and the copper layer fills an opening created in the dielectric layer and the polymer layer. An under-bump-metallurgy (UBM) layer lines the opening and the copper layer is deposited over the UBM layer, and a surface of the copper layer of the first bump facing away from the substrate is curved and is not linear. The two bump structures also includes a second bump with the copper layer with a second thickness, and a surface of the copper layer of the second bump facing away from the substrate is curved and is not linear. The first thickness and the second thickness are significantly different.

Various modifications, changes, and variations apparent to those of skill in the art may be made in the arrangement, operation, and details of the methods and systems disclosed. Although the foregoing disclosure has been described in some detail for purposes of clarity of understanding, it will be apparent that certain changes and modifications may be practiced within the scope of the disclosure. Accordingly, the present embodiments are to be considered as illustrative and not restrictive, and the disclosure is not to be limited to the details given herein, but may be modified within the scope and equivalents of the appended claims.

The invention claimed is:

1. A method of making a plurality of bump structures on a substrate, comprising:
   immersing a substrate in a first plating bath, wherein the substrate is coupled to a cathode; and
   plating a first metal layer in openings of a plurality of bump structures, wherein
      the openings are lined with an under bump metallurgy (UBM) layer,
      the first metal layer is part of the plurality of bump structures, and
      a first anode in the first plating bath is patterned to deposit the first metal layer in the openings of the plurality of bump structures.

2. The method of claim 1, further comprising:
   immersing the substrate in a second plating bath;
   plating a second metal layer on the first metal layer to form the plurality of bump structures, wherein a second anode in the second plating bath is patterned to deposit the second metal layer;
   immersing the substrate in a third plating bath; and
   plating a third metal layer on the second metal layer to form the plurality of bump structures, wherein a third anode in the second plating bath is patterned to deposit the third metal layer.

3. The method of claim 1, wherein the first anode is made of the same metal as the first metal layer and is patterned with a photoresist layer leaving openings facing the plurality of bump structures.

4. The method of claim 2, wherein the second anode and the third anode are made of the same metal as the second metal layer and the third metal layer respectively and is each patterned with a photoresist layer leaving openings facing the plurality of bump structures.

5. The method of claim 1, wherein
   the anode and the substrate are pulled apart during plating, and
   a rate of the anode and the substrate being pulled apart affects shapes of the plurality of bump structures.

6. The method of claim 5, wherein the higher the rate the higher the tangential angle of the first metal layer.

7. The method of claim 1, wherein the first metal layer contains copper and a thickness of the first metal layer is greater than 30 µm.

8. The method of claim 1, wherein plating rate of the first metal layer is between about 0.01 mm/min to about 6.0 mm/min.

9. The method of claim 1, wherein a voltage between the anode and the cathode is between about 0.1 V and 10 V.

10. The method of claim 1, wherein the first anode and the substrate is pulled apart at a rate between 0.01 µm/min to about 1 cm/min.

11. The method of claim 2, wherein the second metal layer is made of a material selected from a group consisting of nickel, tin, tine-lead, gold, silver, palladium, indium, nickel-palladium-gold, nickel-gold or other alloys of above-mentioned elements.

12. The method of claim 2, wherein the third metal layer is made of lead-free solder.

13. A method of making a plurality of bump structures with different heights on a substrate, comprising:
   immersing a substrate in a first plating bath, wherein the substrate is coupled to a cathode;
   plating a first metal layer in openings of a plurality of bump structures, wherein the first metal layer is made of a first metal type,
the first metal layer is part of plurality of bump structures, and
a first anode in the first plating bath is patterned to deposit the first metal layer in the openings of the plurality of bump structures; and plating a second metal layer on a portion of the plurality of bump structures, wherein
the second metal layer is made of the first metal type,
the second metal layer is part of the portion of the plurality of bump structures,
a second anode is used to plate the second metal layer and the second anode is patterned to deposit the second metal layer in the openings of the portion of the plurality of bump structures, and
the portion of the plurality of bump structures deposited with the second metal layer has higher thickness than the other portion not deposited with the second metal layer.

14. The method of claim 13, wherein plating the second metal layer is performed in the first plating bath or in a second plating bath.

15. The method of claim 13, wherein the first metal layer contains copper and bump of the plurality of bump structures have one of two different heights.

16. A method of making a plurality of bump structures on a substrate, comprising:
immersing a substrate in a first plating bath, wherein the substrate is coupled to a cathode;
plating a first metal layer in openings of a plurality of bump structures, wherein
the openings are lined with an under bump metallurgy (UBM) layer,
the first metal layer is part of the plurality of bump structures, and
a first anode in the first plating bath is patterned to deposit the first metal layer in the openings of the plurality of bump structures; and
moving the first anode away from the substrate during the plating the first metal layer, wherein a distance between the first anode and the substrate remains within a range from about 0.1 mm to about 10 cm.

17. The method of claim 16, wherein the moving the first anode comprises moving the anode at a different rate depending on a deposition time.

18. The method of claim 16, further comprising:
immersing the substrate in a second plating bath;
plating a second metal layer on the first metal layer to form the plurality of bump structures, wherein a second anode in the second plating bath is patterned to deposit the second metal layer; and
moving the second anode away from the substrate during the plating the second metal layer, wherein a distance between the second anode and the substrate remains within a range from about 0.1 mm to about 10 cm.

19. The method of claim 18, further comprising:
immersing the substrate in a third plating bath;
plating a third metal layer on the second metal layer to form the plurality of bump structures, wherein a third anode in the third plating bath is patterned to deposit the third metal layer; and
moving the third anode away from the substrate during the plating the second metal layer, wherein a distance between the third anode and the substrate remains within a range from about 0.1 mm to about 10 cm.

20. The method of claim 16, wherein plating the first metal layer in the openings comprises plating a metal dispersed in the first plating bath and the first anode does not dissolve in the first plating bath.

* * * * *